United States Patent
Bernardinis (10) Patent No.: US 9,941,225 B2
(45) Date of Patent: Apr. 10, 2018

(54) SINGLE LEAD-FRAME STACKED DIE GALVANIC ISOLATOR

(71) Applicant: Analog Devices, Inc., Norwood, MA (US)

(72) Inventor: Gabriele Bernardinis, Los Gatos, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/265,138

(22) Filed: Sep. 14, 2016

(65) Prior Publication Data

US 2018/0076154 A1    Mar. 15, 2018

(51) Int. Cl.

| | |
|---|---|
| H01L 27/08 | (2006.01) |
| H01L 23/64 | (2006.01) |
| H01L 25/18 | (2006.01) |
| H01L 25/065 | (2006.01) |
| H01L 23/522 | (2006.01) |
| H01L 23/495 | (2006.01) |
| H01L 23/48 | (2006.01) |
| H01L 25/00 | (2006.01) |
| H01L 21/768 | (2006.01) |

(52) U.S. Cl.
CPC ...... *H01L 23/645* (2013.01); *H01L 21/76885* (2013.01); *H01L 23/481* (2013.01); *H01L 23/49575* (2013.01); *H01L 23/5227* (2013.01); *H01L 25/0657* (2013.01); *H01L 25/18* (2013.01); *H01L 25/50* (2013.01); *H01L 2225/0651* (2013.01); *H01L 2225/06506* (2013.01); *H01L 2225/06541* (2013.01)

(58) Field of Classification Search
CPC ............ H01L 21/76885; H01L 23/481; H01L 23/49575; H01L 23/5227
USPC .................................................. 257/277, 531
See application file for complete search history.

(56) References Cited

U.S. PATENT DOCUMENTS

| | | |
|---|---|---|
| 6,927,662 B2 | 8/2005 | Kahlmann et al. |
| 7,489,526 B2 | 2/2009 | Chen et al. |
| 7,947,600 B2 | 5/2011 | Iwaya et al. |
| 8,237,534 B2 | 8/2012 | Fouquet et al. |

(Continued)

FOREIGN PATENT DOCUMENTS

CN        104022113 A     9/2014

*Primary Examiner* — Tan N Tran
(74) *Attorney, Agent, or Firm* — Wolf, Greenfield & Sacks, P.C.

(57) ABSTRACT

Isolators for providing electrical isolation between two circuits operating at different voltages are described, in which multiple semiconductor dies including the isolator components and the components of the two circuits are stacked on top of each other to provide a laterally-compact arrangement. An isolation barrier electrically separates the two circuits, and the isolator may provide a communication channel for transfer of information and/or power between the two circuits. The isolator may be included in an integrated device having a stacked die configuration where a first semiconductor die includes the isolator and components of the first of the two circuits, and a second semiconductor die positioned over the first semiconductor die includes components of the second of the two circuits. Two components of the isolator may be formed in separate layers of the first semiconductor die.

20 Claims, 5 Drawing Sheets

(56) References Cited

U.S. PATENT DOCUMENTS

| | | | |
|---|---|---|---|
| 8,364,195 B2* | 1/2013 | Spina | H01Q 1/38 |
| | | | 307/104 |
| 8,446,243 B2 | 5/2013 | Strzalkowski et al. | |
| 9,105,391 B2 | 8/2015 | Fouquet et al. | |
| 2008/0311862 A1 | 12/2008 | Spina et al. | |
| 2015/0280785 A1* | 10/2015 | Brauchler | H04B 5/0018 |
| | | | 257/531 |
| 2015/0357113 A1 | 12/2015 | Scholz | |

* cited by examiner

SINGLE LEAD-FRAME STACKED DIE GALVANIC ISOLATOR

FIELD OF THE DISCLOSURE

The present application relates to galvanic isolators providing galvanic isolation between circuits.

BACKGROUND

Isolators provide electrical isolation between circuits which communicate with each other. In some situations, circuits which communicate with each other operate at different voltages, for instance one at a relatively high voltage and the other at a relatively low voltage. In some situations, the circuits are referenced to different electrical ground potentials, such that a voltage in one of the circuits differs from a voltage in the other circuit. Isolators are used to electrically isolate a first circuit, operating in a relatively high voltage domain, from a second circuit, operating in a relatively low voltage domain, or to electrically isolate circuits referenced to different ground potentials. An isolation barrier is proved between the two circuits to prevent undesirable voltage cross-over. The isolator provides communication across the isolation barrier.

SUMMARY OF THE DISCLOSURE

Isolators for providing electrical isolation between two circuits operating at different voltages are described, in which multiple semiconductor dies including the isolator components and the components of the two circuits are stacked on top of each other to provide a laterally-compact arrangement. An isolation barrier electrically separates the two circuits, and the isolator may provide a communication channel for transfer of information and/or power between the two circuits. The isolator may be included in an integrated device having a stacked die configuration where a first semiconductor die includes the isolator and components of the first of the two circuits, and a second semiconductor die positioned over the first semiconductor die includes components of the second of the two circuits. Two components of the isolator may be formed in separate layers of the first semiconductor die.

In some embodiments, an integrated isolator device is provided. The integrated isolator device comprises a first semiconductor die comprising at least one first circuit and at least one isolator having a first isolator component positioned in a first layer of the first semiconductor die and a second isolator component positioned in a second layer of the first semiconductor die. The integrated isolator device further comprises a second semiconductor die positioned over the first semiconductor die. The second semiconductor die has at least one second circuit.

In some embodiments, a method of manufacturing an integrated device having an isolator is provided. The method comprises forming a first isolator component in a first layer of a first semiconductor die. The first semiconductor die includes at least one first circuit. The method further comprises forming a second isolator component in a second layer of the first semiconductor die and positioning a second semiconductor die over the first semiconductor die. The second semiconductor die includes at least one second circuit.

In some embodiments, a system comprising a first semiconductor die and a second semiconductor die positioned over the first semiconductor die. The first semiconductor die comprises at least one first circuit configured to operate in a first voltage domain and at least one isolator having a first isolator component positioned in a first layer of the first semiconductor die and a second isolator component positioned in a second layer of the first semiconductor die. The second semiconductor die has at least one second circuit configured to operate in a second voltage domain different than the first voltage domain.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Electrical isolators and the circuits which they isolate can be microfabricated on semiconductor dies. To make electrical connection to electrical components on a semiconductor die, the die is typically placed on a lead frame, which is a support structure having electrical contact points that can be connected to electrical contact points on the semiconductor die. Aspects of the present application provide electrical (galvanic) isolators which, together with at least some of the components of the circuits they isolate, are formed on multiple semiconductor dies that are stacked on top of each other in a manner allowing for the use of a single lead frame to make electrical connection to the stacked semiconductor dies. Thus, an integrated electrical device including an electrical isolator and isolated circuit components is provided in a stacked semiconductor die structure disposed on a single lead frame, in some embodiments. The stacked die isolator configuration may be applied to various types of isolator technology, including inductive coupling isolators, capacitive coupling isolators, and radio frequency coupling isolators by forming different types of isolator components in one of the semiconductor dies of the stacked die structure.

A benefit of the stacked die configuration for an integrated device having the isolator and two circuits on the same lead frame is that such a configuration may allow for reduced surface area of the integrated device and/or reduced packaging footprint of the integrated device. This, in turn, may reduce manufacturing costs by reducing the amount of some materials used to form the integrated device as well as by saving space from the use of a single lead frame. Moreover, having the integrated device on a single lead frame may reduce the footprint of the packaged integrated device while complying with desired creepage distances, described further below, between conductive parts, including lead frames and package pads or pins. For example, the techniques of the present application may allow for up to, approximately, a 40% package size reduction in comparison to isolation devices having two or more lead frames. In some embodiments, a dimension of the integrated device may be in the range of 1.5 mm to 5 mm. The surface area occupied by the integrated isolator device may be in the range of 6 mm$^2$ to 12 mm$^2$. Thus, compact isolator structures may be achieved.

Compliance with one or more creepage distance values to reduce or remove electrostatic discharge can impact the footprint of integrated devices, particularly devices that act to isolate circuits connected to different voltage domains. Creepage distances may apply to distances between two electrical contacts, including distances between electrical points operating at different voltages. An integrated device may be considered to comply with a creepage distance value when a distance between two electrical points of the device is equal to or larger than a predetermined value, which may vary depending on one or more factors including the type of packaging material used in the resulting device, a market or industry (e.g., medical, consumer) standard, and/or a country standard. External creepage may refer to the distance between electrical contacts (e.g., package pads or pins) that act as inputs and electrical contacts that act as outputs of an integrated device. External creepage guidelines may call for a distance of a few millimeters (e.g., in the range of 2 mm to 6 mm) between electrical contacts. Internal creepage may refer to the distance between two lead frames of an integrated device or a lead frame and a package or pin of an integrated device. Internal creepage guidelines may call for a distance of a few hundred microns (e.g., in the range of 300 to 800 microns). Use of multiple lead frames to form an isolator typically will occupy a larger footprint than a single lead frame not only because of the size and shape of the lead frames but because of the area occupied to comply with certain internal creepage values between the lead frames in at least some applications. Thus, while the dimensions of the lead frames may accommodate external creepage values, the footprint of a device may be limited by internal creepage values. Aspects of the present application include an integrated isolator device having a single lead frame, which in at least some embodiments provides a reduced footprint of the integrated isolator device in comparison to devices having multiple lead frames. For devices having a single lead frame, a limitation on the footprint may be compliance with external creepage values because one or more dimensions of the lead frame may become smaller than the external creepage. Accordingly, aspects of the present application relate to integrated devices that accommodate compliance with creepage values, including external and internal, for devices with a single lead frame.

Figure 1:
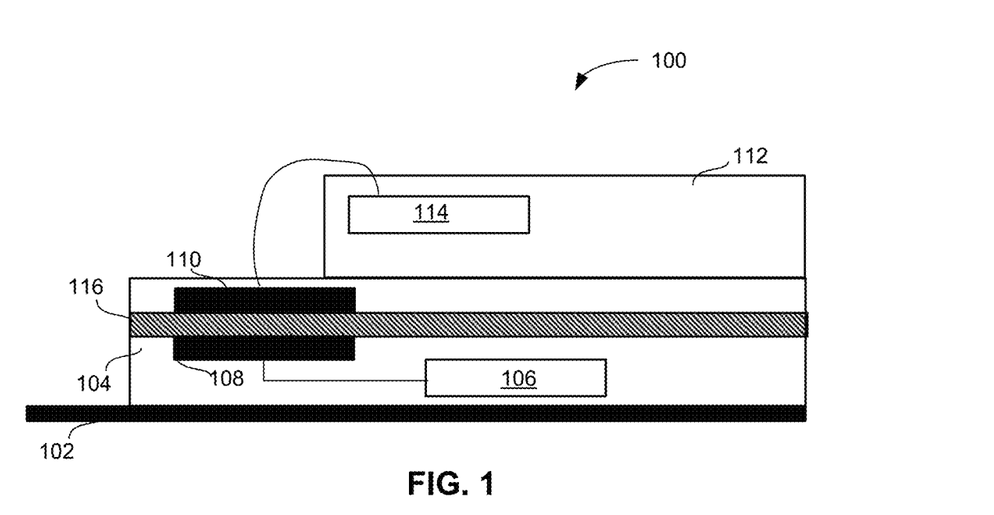
FIG. 1 is a diagram of an integrated isolator device having a stacked configuration.

FIG. 1 shows integrated isolator device 100 formed on lead frame 102. The integrated isolator device 100 includes a first semiconductor die 104 and a second semiconductor die 112. The first semiconductor die has circuit 106 and an isolator having components 108 and 110. The second semiconductor die 112 has circuit 114. Isolation barrier 116 is positioned between circuit 106 and circuit 114, and may provide galvanic isolation to reduce or prevent entirely current flow between circuit 106 and circuit 114. Isolation barrier 116 may have one or more layers. Although one isolator is shown in FIG. 1, it should be appreciated that multiple isolators may be formed in the first semiconductor die. In some embodiments, a first isolator in the first semiconductor die may couple with a second semiconductor die and a second isolator in the first semiconductor die may couple with a third semiconductor die. In such embodiments, both the second and third semiconductor dies may be positioned over the first semiconductor die.

Circuits 106 and 114 may act as input and output circuitry to the isolator. In some embodiments, circuit 106 may include a transmitter and circuit 114 may include a receiver such that power and/or information is transferred from circuit 106 of the first semiconductor die 104 to circuit 114 of the second semiconductor die 112. In other embodiments, circuit 114 may include a transmitter and circuit 106 may include a receiver. In some embodiments, both circuits 106 and 114 may be transceivers. In some embodiments, both circuits 106 and 114 may be receivers. Circuits 106 and 114 may be configured to operate at different voltages or may be referenced to different ground potentials, and the isolator may allow for circuits 106 and 114 to exchange information. The resulting integrated device may be applied to a variety of applications (e.g., industrial, medical, consumer) where isolators may be used, including isolator control switches and isolated power supply controllers. As an example, a piece of industrial machinery may operate at high voltage and be controlled by a computer of other control equipment that operates at a much lower voltage, with the two communicating via an isolator of the type illustrated. Circuits 106 and 114 may electrically couple with two different power supplies and/or circuits 106 and 114 may electrically couple with separate ground references. In some embodiments, circuit 106 may couple to a ground reference or signal contact separate from the lead frame 102, such as a package or pin of the integrated device. In other embodiments, circuit 106 may electrically couple with a ground reference of the lead frame 102. Circuit 114 may couple with a ground reference or signal contact separate from the lead frame 102, such as a package pad or pin.

The isolator components 108 and 110 are formed in two layers of the first semiconductor die 104, with isolator component 108 being formed in a first layer of the first semiconductor die 104 and isolator component 110 being formed in a second layer of the first semiconductor die 104. In some embodiments, the isolator may be a transformer configured to provide communication through inductive coupling between coils, with isolator components 108 and 110 being such coils. In some embodiments, the isolator may be a capacitive isolator configured to provide communication through capacitive coupling between capacitive plates, with isolator components 108 and 110 being capacitor plates. In some embodiments, the isolator may be a radio frequency isolator configured to provide communication through radio frequency coupling between antennae, with isolator components 108 and 110 each being an antenna.

Isolation barrier 116 positioned between isolator components 108 and 110 of the first semiconductor die 104 may provide a desired level of galvanic isolation between circuits 106 and 114 while allowing for coupling between isolator components 108 and 110 to occur. To allow for coupling to occur (e.g., inductive coupling, capacitive coupling, or radio frequency coupling), isolator components 108 and 110 may be positioned in relatively close proximity. Accordingly, one or more characteristics (e.g., material, thickness) of isolation barrier 116 may allow for galvanic isolation between circuits 106 and 114 in addition to coupling between isolator components 108 and 110. The isolation barrier 116 may balance a level of galvanic isolation with signal loss through the isolator between circuits 106 and 114. Isolation barrier 116 may impact the performance of integrated isolator device 100 such that the integrated device 116 is not limited by the level of power used to compensate for signal loss through the isolator. Examples of suitable materials for isolation barrier 116 include one or more polyimides. The thickness of the isolation barrier 116 may be in the range of 5 microns to 50 microns, or any value or range of values in that range.

The performance of the integrated isolator device 100 may be impacted by electrostatic discharge and other losses that arise from the relative proximity of different electrical components. In embodiments where second semiconductor die 1112 couples to a separate contact (e.g., lead frame, pad, pin), a distance between lead frame 102 and the separate contact may meet internal creepage compliance and the distance may be at least 350 microns, between 350 microns and 1 mm, or any other suitable value. In some embodiments, the distance between the lead frame and the contact is approximately 400 microns. Another consideration in the performance of an integrated isolator device, such as integrated isolator device 100, is the distance from second die 112 to lead frame 102. Maintaining this distance in compliance with specified creepage parameters for a particular application may reduce the chance of undesirable electrostatic discharge. In some embodiments, a distance between the second die 112 and lead frame 102 may be at least 350 microns, between 350 microns and 1 mm, or any other suitable value. In some embodiments, the distance between the second die 112 and lead frame 102 is approximately 400 microns. Another consideration in the performance of an integrated isolator device, such as integrated isolator device 100, is the distance between isolator component 110, which couples to circuit 114 of second semiconductor die 112, and lead frame 102. A distance between isolator component 110 and lead frame 102 may be in the range of 300 microns to 450 microns, or any value or range of values in that range. In some embodiments, the distance may be at least 300 microns.

Figure 2A:
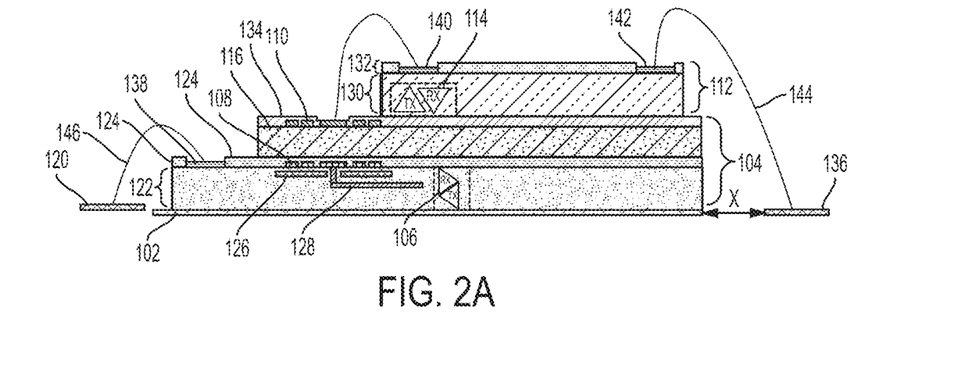
FIG. 2A is a cross-sectional view of an integrated isolator device having a stacked configuration in which a second semiconductor die stacked on a first semiconductor die does not overlap an isolator of the first semiconductor die.

FIG. 2A shows a cross-sectional view of an integrated isolator device having first semiconductor die 104 and second semiconductor die 112 positioned over lead frame 102. In the embodiment shown in FIGS. 2A and 2B, the second semiconductor die 112 may be non-overlapping with isolator components 110 and 108. First semiconductor die 104 may include circuitry layer 122 having circuit 106, which may include a transmitter (TX) and/or a receiver (RX), and passivation layer 124. Circuitry layer 122 may include one or more connections 128, which electrically couple circuit 106 to isolator 108 positioned in passivation layer 124. In some embodiments, circuitry layer 122 may include one or more shielding components 126 positioned to reduce signal loss and improve the performance of the integrated device. In some embodiments, a shielding component 126 may be positioned between isolator component 108 and a connection 128. First semiconductor die 104 may include passivation layer 134, where isolator component 110 is positioned in passivation layer 134. Isolation barrier 116 may be positioned between passivation layer 124 and passivation layer 134. Contact 120 may be any suitable contact external to the integrated isolator device, including an external pin or pad. Contact 120 may be electrically coupled (e.g., wire bonded) to contact 138 of first semiconductor die 104. Contact 120 may provide an electrical ground reference to the first semiconductor die 104, including its circuitry (e.g., circuit 106), or may be a signal connection for the first semiconductor die 104. Wire bond 146 may couple contact 120 to contact 138. Although not shown in FIG. 2A, contact 138 may be electrically coupled (e.g., wire bonded) to lead frame 102 and the lead frame may provide an electrical ground reference to the first semiconductor die 104 in some embodiments. Contact 138 may be formed by removing a portion of the passivation layer 124 and depositing one or more metals, or may be formed in any other suitable manner. In some embodiments, the physical contact between lead frame 102 and circuitry layer 122 may provide an electrical ground reference, which may remove the need for the electrical connection between contacts 138 and 120.

Second semiconductor die 112 may include passivation layer 132 and circuitry layer 130 having circuit 114, which may include a transmitter (TX) and/or a receiver (RX). Contacts 140 and 142 of second semiconductor die 112 may electrically couple to circuitry layer 130 and may be used to connect circuit 114 to other components of the integrated device. Contact 140 may be electrically coupled (e.g., wire bonded) to isolator component 110. Contact 142 may be electrically coupled to circuitry layer 130 and be used to connect circuit 114 to contact 136. Contact 136 may be any suitable contact external to the integrated isolator device, including an external pin or pad. Wire bond 144 may connect contact 142 to contact 136.

Figure 2B:
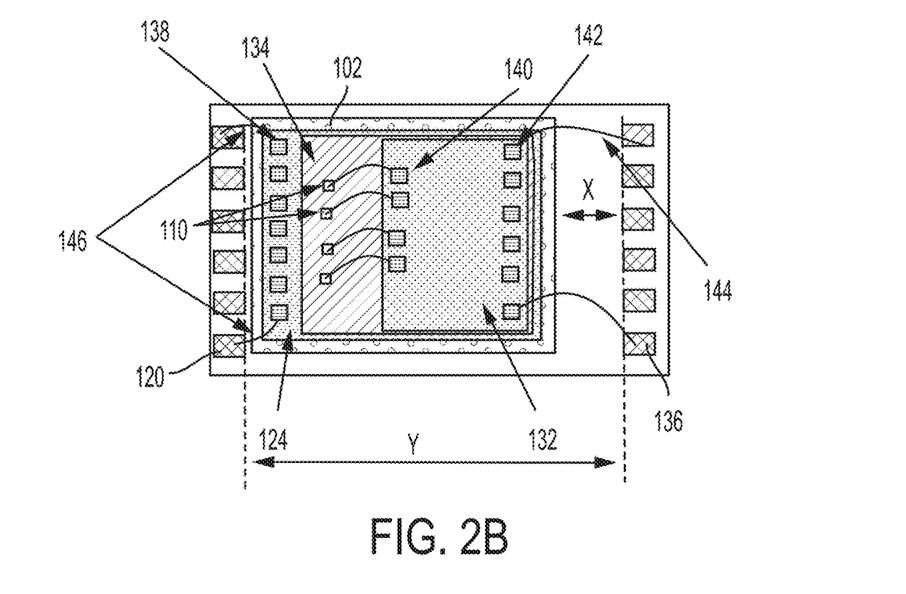
FIG. 2B is a planar view of the integrated isolator device shown in FIG. 2A.

FIG. 2B is a planar view of the integrated device shown in FIG. 2A. It can be seen in FIG. 2B that the positioning of the second semiconductor die 112 on top of the first semiconductor die 104 is such that the isolator in the first semiconductor die is not covered by the second semiconductor die. As shown in FIGS. 2A and 2B, the distance X is the distance between lead frame 102 and contact 136 of the integrated device and may be selected to meet internal creepage specifications. Internal creepage specifications may include a minimum distance between conductive points (e.g., cemented joints) of the integrated device, and the minimum distance may depend on industry standards and/or packaging materials used in packaging the integrated device. Complying with internal creepage specifications may include having distance X be equal to or greater than the minimum distance. In some embodiments, distance X may be in the range of 350 microns to 750 microns, or any value or range of values within that range. The distance Y is the distance between contacts 120 and 136 of the integrated device. Distance Y may have a value selected to meet external creepage specifications. External creepage specifications may include a minimum distance between pads and/or pins of an integrated device, which may depend on industry standards and/or packaging materials used in packaging the integrated device. Complying with external creepage specifications may include having distance Y be equal to or greater than the minimum distance. In some embodiments, distance Y may be in the range of 0.5 mm to 15 mm, or any value or range of values within that range.

Some embodiments of the present application relate to an integrated isolator device having more than one secondary die positioned over the first semiconductor die in which the isolator is formed. In such embodiments, the integrated device may provide more than one galvanic isolation between a first semiconductor die and a second semiconductor die. That is, the first semiconductor die may include multiple isolators. The multiple secondary dies may be sized and shaped for packaging and to be creepage compliant. In some embodiments, package pads and/or pins may be arranged to meet one or more creepage compliance values.

Figure 2C:
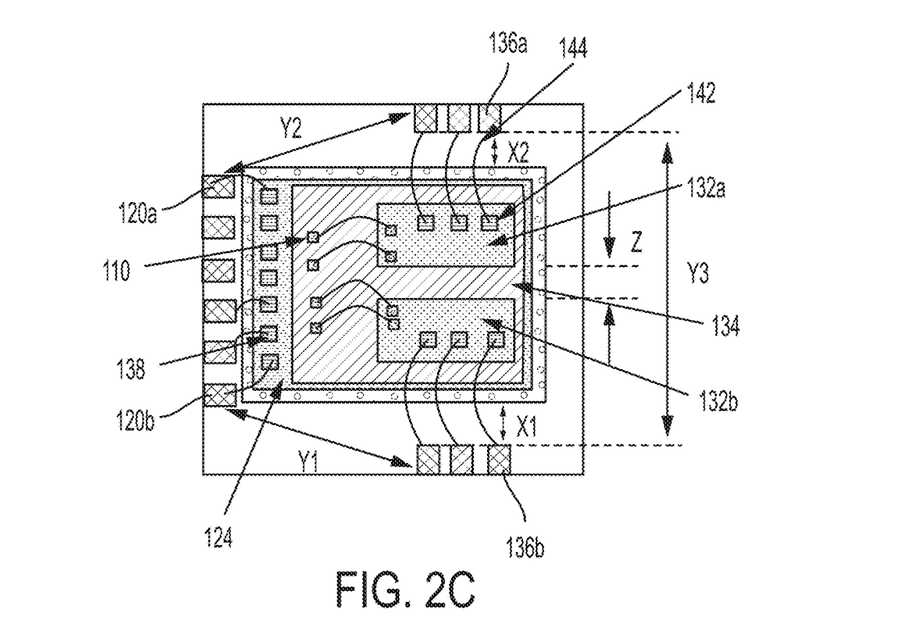
FIG. 2C is a planar view of an integrated isolator device having two semiconductor dies positioned on top of another semiconductor die in which an isolator is formed.

FIG. 2C shows an exemplary planar view of an integrated device having two semiconductor dies disposed in a side-by-side configuration and positioned on semiconductor die having passivation layers 134 and 124. The two side-by-side semiconductor dies may each have a passivation layer 132 and a circuitry layer 130, as discussed above with reference to FIG. 2A. As shown in FIG. 2C, passivation layer 132a is for one of the two side-by-side semiconductor dies and passivation layer 132b is for the other semiconductor die. Distances Y1, Y2, and Y3 may assume values complying with a board level external creepage specifications to provide a desired amount of isolation for the integrated device. The distance Y1 is the distance between contacts 120b and 136b of the integrated device. The distance Y2 is the distance between contacts 120a and 136a. The distance Y3 is the distance between contacts 136a and 136b. Contacts 120a, 120b, 136a, and 136b may be pads and/or pins of the integrated device. In some embodiments, distances Y1, Y2, and Y3 may be in the range of 0.5 mm to 15 mm, or any value or range of values within that range. Distances X1 and X2 may have values complying with internal creepage guidelines. The distance X1 is the distance between contact 136b and lead frame 102. Contact 136b may electrically couple to a contact of semiconductor die having passivation layer 132b. The distance X2 is the distance between contact 136a and lead frame 102. Contact 136a may electrically couple to a contact of semiconductor die having passivation layer 132a. Distances X1 and X2 may be in the range of 350 microns to 750 microns, or any value or range of values within that range. Distance Z, representing the distance between the two side-by side semiconductor dies, may have a value selected to reduce electrical discharge between the dies and to reduce or eliminate the risk of electrical breakdown between the semiconductor dies.

The integrated isolator device of FIG. 2C may provide multiple isolators. For example, one isolator may be provided to isolate a circuit on semiconductor die 104 from one on semiconductor die having passivation layer 132a. A separate isolator may be provided to isolate a circuit on semiconductor die 104 from one on semiconductor die having passivation layer 132b. In this manner, multiple isolators may be provided while still providing a stacked integrated isolator device on a single lead frame. The isolators may be on the semiconductor die 104 in some embodiments.

In some embodiments of a stacked integrated isolator device having an isolator in a first semiconductor die on which one or more semiconductor dies are stacked, a portion of the second semiconductor die may overlap with some or all of the isolator on the first semiconductor die. A benefit of an integrated device having this configuration is that the second semiconductor die may occupy additional surface area that may be otherwise used to form surface contacts for the isolator. Such a configuration may allow for the integrated device to have a larger second semiconductor die in comparison to where the second semiconductor die is non-overlapping with the isolator, such as the integrated isolator device shown in FIG. 2A. The amount of additional surface area the second semiconductor die may occupy can depend on the surface area of the first semiconductor die and/or a distance between the second semiconductor die and the first semiconductor die (e.g., a distance of a top surface of the second semiconductor die and an conductive part of the first semiconductor die) to comply with creepage guidelines. For example, the second semiconductor die that overlaps with the isolator may have approximately 10% larger surface area than an integrated device that does not overlap with the isolator, such as the device shown in FIG. 2A.

Figure 3A:
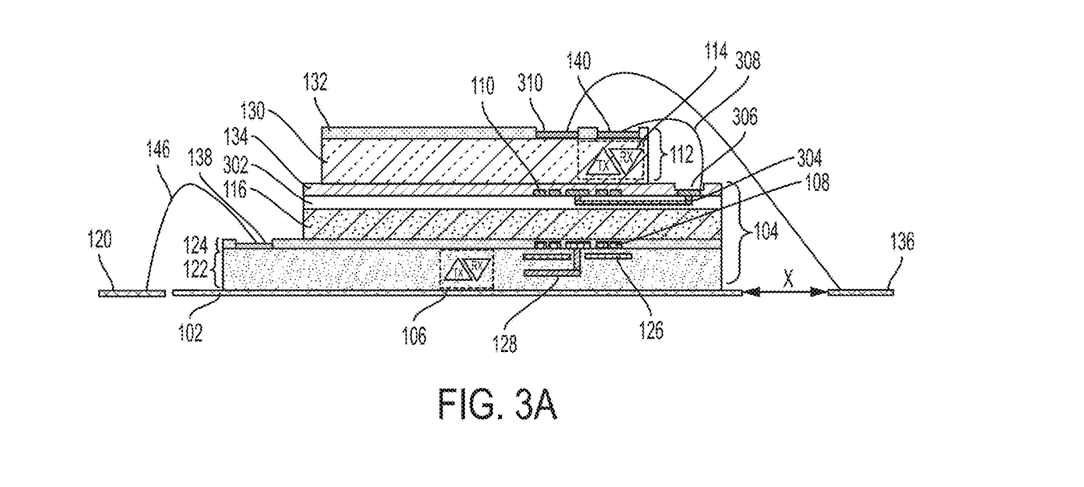
FIG. 3A is a cross-sectional view of an integrated isolator device having a stacked configuration in which a second semiconductor die stacked on a first semiconductor die overlaps with an isolator of the first semiconductor die.

In embodiments in which the second semiconductor die overlaps with some or all of the isolator, the first semiconductor die may include an oxide layer positioned between the isolation barrier and the isolator component configured to couple with the second semiconductor die. The oxide layer may include one or more electrical connections to connect the isolator component to a contact of the first semiconductor die. FIG. 3A shows a cross-sectional view of an integrated isolator device in which second semiconductor die 112 is positioned to overlap with isolator components 110 and 108 on a first semiconductor die 104. In this embodiment, the first semiconductor die 104 shown in FIG. 3A includes an oxide layer 302 (e.g., thermal silicon oxide) positioned between passivation layer 134 and isolation barrier 116. The oxide layer 302 may include one or more electrical connections 304, which may act as an underpath through the oxide layer 302 and couple isolator component 110 to contact 306. An electrical connection 304 may be formed of one or more metals. Contact 306 may be wire bonded to contact 140 of second semiconductor die 112 by a wire bond 308. Contact 310 may electrically couple circuitry layer (e.g., circuit 114) to contact 136, such as through a wire bonding.

Figure 3B:
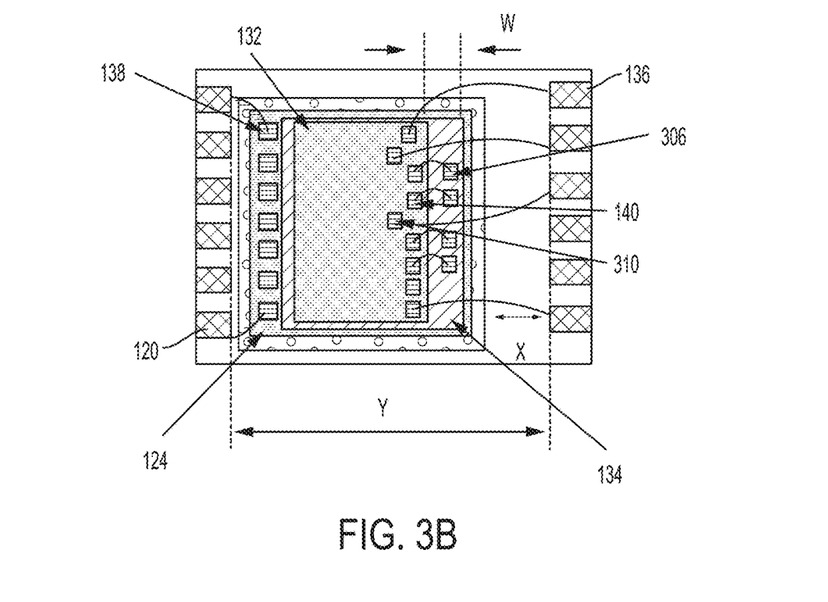
FIG. 3B is a planar view of the integrated isolator device shown in FIG. 3A.

FIG. 3B shows a planar view of the integrated isolator device shown in FIG. 3A. In addition to distances Y and X discussed above, distance W between contacts of the two semiconductor dies, which may be connected by wire bonds, may have a value selected to allow for bonding between the two semiconductor dies and/or comply with creepage specifications. For example, distance W may be between contact 306 of the first semiconductor die 104 and contact 140 of the second semiconductor die 112. Distance W may provide a desired distance to allow wire bonding between the two semiconductor dies, such as through down bonding. Distance W may be in the range of 50 microns to 250 microns, or any value or range of values within that range. In some embodiments, distance W may be approximately 150 microns. Compliance with creepage guidelines may be an additional consideration to allow a desired level of electrical isolation between contacts of the two semiconductor dies, such as contact 140 and 306. A vertical dimension or height of the second semiconductor die 112 may have a value selected to comply with creepage guidelines. The vertical dimension of the second semiconductor die 112 may be in the range of 100 microns to 400 microns, or any value or range of values within that range.

Figure 4A:
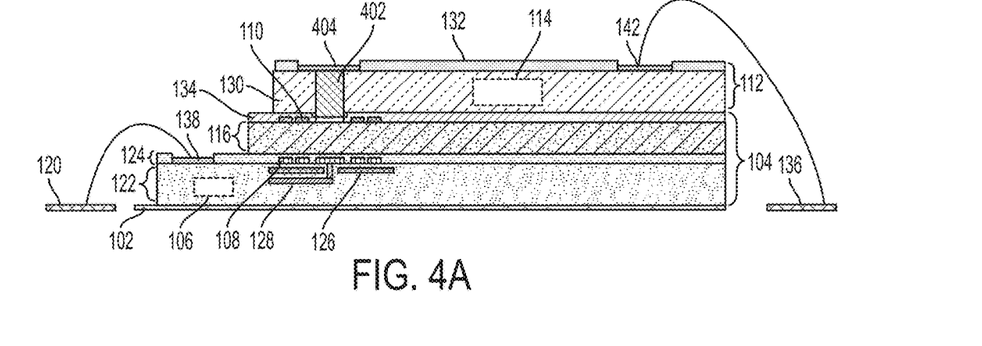
FIG. 4A is cross-sectional view of an integrated isolator device having a stacked configuration in which a second semiconductor die is stacked on top of a first semiconductor die and a via is formed through the second semiconductor die.

While FIG. 3A illustrates an embodiment in which an isolator in one semiconductor die is overlapped by another semiconductor die and coupled to the overlying semiconductor die by wire bonds, other techniques may be used to couple the isolator to the overlying semiconductor die. In some embodiments, one or more vias (e.g., silicon vias, such as a through silicon via (TSV)) may be formed through the circuitry layer of the second semiconductor die and may electrically couple the isolator to a contact of the second semiconductor die. As an example, FIG. 4A shows a cross-sectional view of an integrated isolator device in which the second semiconductor die 112 includes via 402. Via 402 may extend through circuitry layer 130 and connect isolator component 110 to contact 404. Via 402 may include silicon, although other materials may be implemented. Contact 404 may electrically couple with circuitry layer 130 (e.g., circuit 114).

In some embodiments, one or more pillars (e.g., copper pillars) may be positioned between the second semiconductor die and the first semiconductor die of a stacked die device. In such embodiments, the second semiconductor die may be positioned a distance from the first semiconductor die such that air or other suitable material fills a space between the first and second semiconductor dies. A pillar may electrically couple an isolator of the first semiconductor die to a contact of the second semiconductor die. A pillar may electrically couple contacts of the two semiconductor dies, which may ease wire bonding to an external contact, such as during packaging.

Figure 4B:
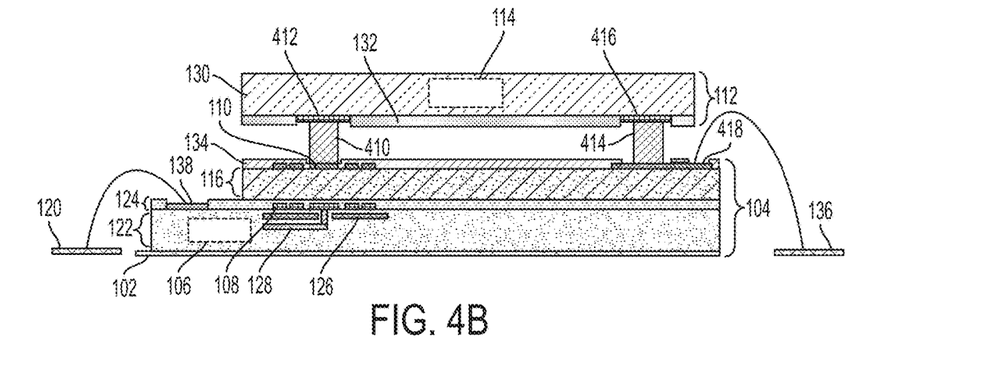
FIG. 4B is a cross-sectional view of an integrated isolator device having a stacked configuration that includes a pillar positioned between a first semiconductor die and a second semiconductor die.

FIG. 4B shows a cross-sectional view of an integrated isolator device having pillars 410 and 414. Pillar 410 may electrically couple isolator component 110 to contact 412. Pillar 414 may electrically couple contact 416 of the second semiconductor die 112 to contact 418 of the first semiconductor die, which may be wire bonded to contact 136 positioned separate from lead frame 102. Pillar 414 may allow for the exchange of power and/or data/information between circuitry layer 130 and contact 136. For example, pillar 414 may route a signal from circuit 114 of the second semiconductor die 112 to contact 136. Forming pillar 414 may ease fabrication of an electrical connection between contact 416 and contact 136 because of challenges that may arise in wire bonding contact 136 directly to contact 416, which may be considered "up bonding." Pillar 414 removes these challenges because contact 136 can bond to contact 418, such as through a "down bonding" process. Pillars 410 and 414 may include metal (e.g., copper), although other materials may be implemented. Since second semiconductor die 112 is positioned relative to first semiconductor die 104 such that passivation layers 132 and 134 are proximate to one another, the integrated isolator device shown in FIG. 4B may be considered to have a flipchip-on-die configuration. In some embodiments, there may be multiple second semiconductor dies positioned over the first semiconductor die and additional pillars configured to electrically couple each of the second semiconductor dies to the first semiconductor die.

Figure 4C:
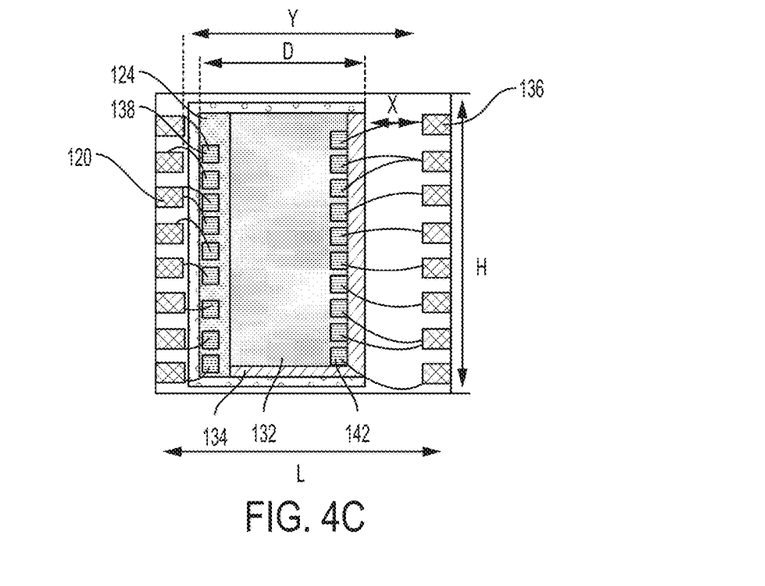
FIG. 4C is a planar view of the integrated device shown in FIG. 4A.

FIG. 4C shows a planar view of the integrated device shown in FIG. 4A. A contact 142 may be electrically coupled to a contact 136, and a contact 138 may be electrically coupled to a contact 120. FIG. 4C show several planar dimensions of the integrated devices, including X and Y discussed above. The dimensions shown in FIG. 4C may apply to the integrated device shown in FIG. 4B. The first semiconductor die may have a dimension D in a direction along a line between a contact of the first semiconductor die, such as contact 138, and a contact of the second semiconductor die, such as contact 142 shown in FIG. 4C or contact 418 of the integrated device shown in FIG. 4B. As shown in FIG. 4C, the dimension D may be a dimension of layer 124. The dimension D of the first semiconductor die 104 may be in the range of 0.5 mm to 2 mm, or any value or range of values within that range. The integrated device may have a dimension L along a line between contacts (e.g., pads and/or pins) on opposite sides of the integrated device, such as a line between contacts 120 and 136 The dimension L of the integrated device may be in the range of 1.5 mm to 3.5 mm, or any value or range of values within that range. The integrated device may have a dimension H along a side of the integrated device that intersects multiple contacts (e.g., pads and/or pins) on the side, such as contacts 136. A dimension H of the integrated device may be in the range of 3 mm to 5 mm, or any value or range of values within that range.

Figure 5:
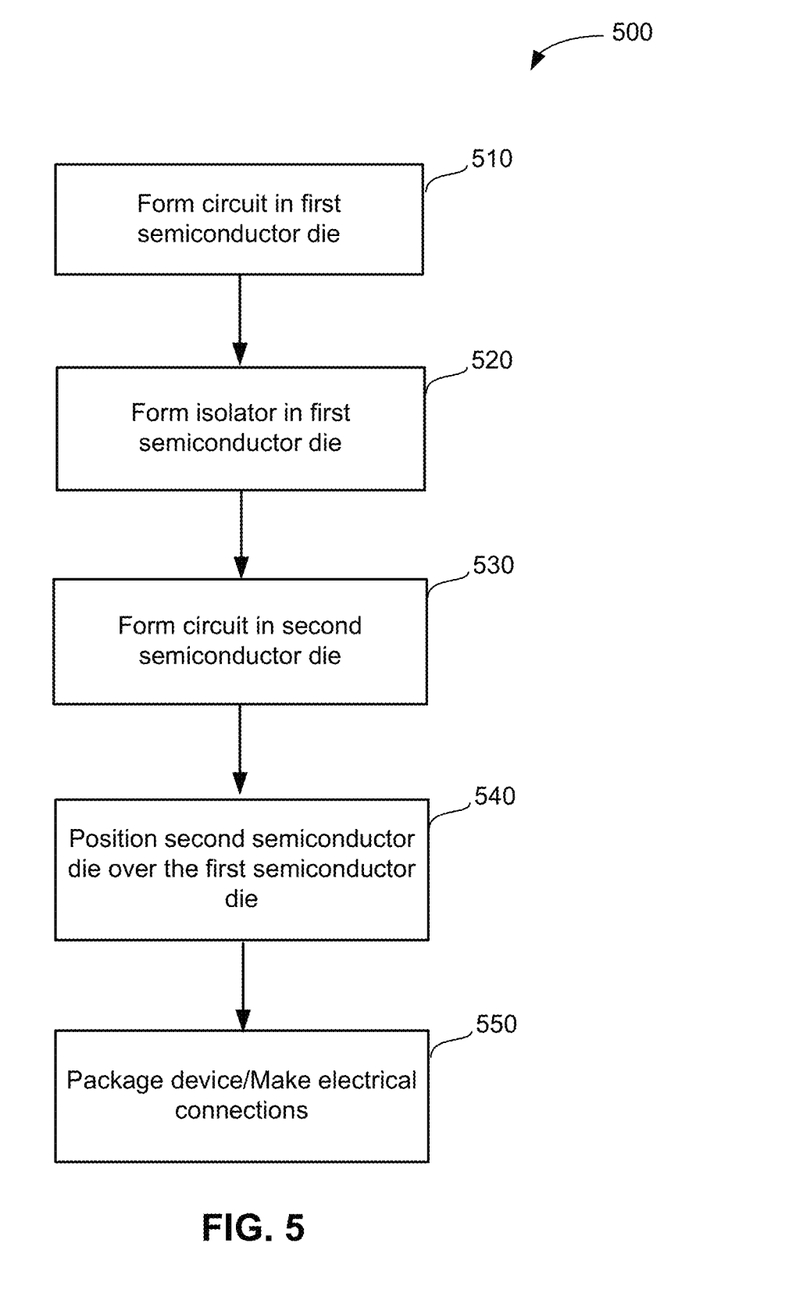
FIG. 5 is an exemplary method of manufacturing an integrated isolator device of the types described herein having a stacked configuration.

Some embodiments of the present application relate to methods of forming an integrated device having a stacked configuration according to the techniques described herein. FIG. 5 shows an exemplary method of manufacturing 500. At act 510, a circuit may be formed in a first semiconductor die. The circuit of the first semiconductor die may include a transmitter and/or a receiver. In some embodiments, the circuit of the first semiconductor die may be formed in a circuitry layer of the die. At act 520, an isolator may be formed in the first semiconductor die. The isolator includes isolator components, the type of which may depend on the type of isolation desired (e.g., coils, plates, antennas). The isolator components may be formed in different layers of the first semiconductor die such that a first isolator component is formed in a first layer and a second isolator component is formed in a second layer. In some embodiments, the isolator components may be formed in a passivation layer, such as passivation layers 124 and 134 described previously herein. An isolation barrier may be formed between the isolator components. In some embodiments, one or more electrical connections may be formed within an oxide layer of the first semiconductor die, such as electrical connections 304 described previously herein. The one or more electrical connections may act as an underpath and connect the second isolator component to a contact, such as contact 306 described previously herein. At act 530, a circuit may be formed in a second semiconductor die. The circuit of the second semiconductor die may include a transmitter and/or a receiver. In some embodiments, a via may be formed to extend through one or more layers of the second semiconductor die. The via may extend through a circuitry layer of the second semiconductor die. The via may electrically couple the second isolator component to a contact of the second semiconductor die. The via may include silicon.

At act 540, the second semiconductor die may be positioned over the first semiconductor die. In some embodiments, the second semiconductor die may be positioned to not overlap with the isolator of the first semiconductor die. In some embodiments, the second semiconductor die may be positioned to overlap with the second isolator component of the first semiconductor die. In some embodiments, the second semiconductor die may contact the first semiconductor die. In some embodiments, the second semiconductor die and the first semiconductor die may have between them a space filled with air or other materials. In some embodiments, the first semiconductor die may be attached to a lead frame (e.g., paddle, pad) prior to positioning the second semiconductor die over the first semiconductor die.

In some embodiments, the second semiconductor die and the first semiconductor die may have a flipchip-on-die configuration where the second semiconductor die is flipped such that the passivation layers of the first and second semiconductor dies are proximate to each other, such as passivation layers 132 and 134 of the integrated device shown in FIG. 4B. In such embodiments, a pillar positioned between the first and second semiconductor dies may electrically couple the isolator to a contact of the second semiconductor die. The pillar may be formed of one or more metals (e.g., copper). The pillar may be formed on the second semiconductor die, (e.g., by growing the pillar on a surface of the second semiconductor die), prior to positioning the second semiconductor die over the first semiconductor die. In embodiments where the pillar is grown on a surface of the second semiconductor die, the second semiconductor die is positioned over the first semiconductor die such that the surface with the pillar is proximate to the first semiconductor die. In some embodiments, an electrical connection between the first semiconductor die and a pad and/or pin may be formed before positioning of the second semiconductor die over the first semiconductor die. For example, a method of forming the integrated device shown in FIG. 4B may include forming pillars 410 and 414 on second semiconductor die 112 and forming an electrical connection (e.g., wire bonding) between contact 418 of the first semiconductor die 104 and contact 136 prior to positioning the second semiconductor die 112 over the first semiconductor die 104.

At act 550, packaging of the integrated device may include forming electrical connections, including contacts and wire bonding to contacts, pins, and/or pads, may be made using any suitable techniques. Electrical connections may be formed between the first and second semiconductor dies (e.g., a contact for the second isolator component to the second semiconductor die) and between a die and one or more package pads or leads. In some embodiments, packaging of the integrated device may include positioning the stacked die configuration of the first and second semiconductor dies over a single lead frame.

The integrated isolator devices described herein may be used in various applications (e.g., industrial, medical, consumer). For example, data transfer and/or power transfer between galvanically isolated systems may be accomplished with the integrated isolator devices described herein. As one example, medical equipment in a room in which a medical procedure is being performed may be galvanically isolated from a control system in a control room. For instance, a piece of medical imaging equipment and/or monitors in the room in which the procedure is being performed may be isolated from a system controlling operation of the imaging equipment and/or display. The isolator may be an integrated isolator device of any of the types described herein, and the isolated signal path may be analog or digital.

As another example, industrial equipment may be isolated from a control system controlling the equipment. For example, high wattage motors may be isolated from control systems controlling their operation by integrated isolator devices of the types described herein. The control systems may operate at a lower wattage than the high wattage motors used by the industrial equipment. The isolator may be disposed on a circuit board on which various circuit components connected to the motors and/or control equipment are included.

Other uses of the integrated isolator devices described herein are also possible, as those examples described are non-limiting.

As described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An integrated isolator device comprising:
    a single first semiconductor die comprising:
        at least one first circuit;
        an isolator having a first isolator component positioned in a first layer of the first semiconductor die and coupled to the at least one first circuit, and the isolator further having a second isolator component positioned in a second layer of the first semiconductor die; and
        an isolation barrier positioned between the first isolator component and the second isolator component; and
    a second semiconductor die positioned over the first semiconductor die, wherein the second semiconductor die has at least one second circuit coupled to the second isolator component.

2. The integrated isolator device of claim 1, wherein the first isolator component is configured to operate at a first voltage and the second isolator component is configured to operate at a second voltage different than the first voltage.

3. The integrated isolator device of claim 2, wherein the at least one first circuit is configured to operate at the first voltage and the at least one second circuit is configured to operate at the second voltage.

4. The integrated isolator device of claim 1, wherein the at least one first circuit includes a transmitter or a receiver and the at least one second circuit includes a transmitter or a receiver.

5. The integrated isolator device of claim 1, wherein the integrated device further comprises a lead frame and the first semiconductor die is mounted on the lead frame.

6. The integrated isolator device of claim 1, wherein the isolator includes a transformer, and the first isolator component and the second isolator component are coils.

7. The integrated isolator device of claim 1, wherein the second semiconductor die and the isolator are non-overlapping.

8. The integrated isolator device of claim 1, wherein the second semiconductor die is positioned over the isolator.

9. The integrated isolator device of claim 8, further comprising at least one via through the second semiconductor die, wherein the at least one via electrically couples the second isolator component to a contact of the second semiconductor die.

10. The integrated isolator device of claim 8, further comprising at least one pillar positioned between the first semiconductor die and the second semiconductor die, wherein the at least one pillar electrically couples the second isolator component to a contact of the second semiconductor die.

11. A method of manufacturing an integrated device having an isolator, the method comprising:
    forming a first isolator component of the isolator in a first layer of a first semiconductor die, wherein the first semiconductor die is a single semiconductor die and includes at least one first circuit coupled to the first isolator component;
    forming a second isolator component of the isolator in a second layer of the first semiconductor die;
    forming an isolation barrier in the first semiconductor die between the first isolator component and the second isolator component; and
    positioning a second semiconductor die over the first semiconductor die, wherein the second semiconductor die includes at least one second circuit coupled to the second isolator component.

12. The method of claim 11, wherein positioning the second semiconductor die over the first semiconductor die comprises positioning the second semiconductor die to overlap with the second isolator component of the first semiconductor die.

13. The method of claim 11, further comprising forming a pillar between the first semiconductor die and the second semiconductor die.

14. The method of claim 13, wherein forming the pillar comprises forming the pillar to electrically couple with the second isolator component and a contact of the second semiconductor die.

15. The method of claim 11, further comprising forming a via through a circuitry layer of the second semiconductor die to electrically couple the second isolator component to a contact of the second semiconductor die.

16. A system, comprising:
a single first semiconductor die comprising:
at least one first circuit configured to operate in a first voltage domain;
an isolator having a first isolator component positioned in a first layer of the first semiconductor die and coupled to the at least one first circuit, and the isolator further having a second isolator component positioned in a second layer of the first semiconductor die;
an isolation barrier positioned between the first isolator component and the second isolator component; and
a second semiconductor die positioned over the first semiconductor die, wherein the second semiconductor die has at least one second circuit coupled to the second isolator component and configured to operate in a second voltage domain different than the first voltage domain.

17. The system of claim 16, further comprising a first lead frame on which the first semiconductor die is disposed, wherein an electrical contact on the first semiconductor die is electrically coupled to an electrical contact on the first lead frame, and wherein an electrical contact on the second semiconductor die is electrically coupled to an electrical contact on a second lead frame.

18. The system of claim 16, wherein the second semiconductor die is positioned over the isolator.

19. The system of claim 18, further comprising at least one via through the second semiconductor die, wherein the at least one via electrically couples the second isolator component to a contact of the second semiconductor die.

20. The system of claim 18, further comprising at least one pillar positioned between the first semiconductor die and the second semiconductor die, wherein the at least one pillar electrically couples the second isolator component to a contact of the second semiconductor die.

* * * * *